(12) United States Patent
Mathad et al.

(10) Patent No.: US 6,743,727 B2
(45) Date of Patent: Jun. 1, 2004

(54) METHOD OF ETCHING HIGH ASPECT RATIO OPENINGS

(75) Inventors: Gangadhara S. Mathad, Poughkeepsie, NY (US); Siddhartha Panda, Beacon, NY (US); Rajiv M. Ranade, Brewster, NY (US)

(73) Assignee: International Business Machines Corporation, Armonk, NY (US)

( * ) Notice: Subject to any disclaimer, the term of this patent is extended or adjusted under 35 U.S.C. 154(b) by 458 days.

(21) Appl. No.: 09/874,109

(22) Filed: Jun. 5, 2001

(65) Prior Publication Data

US 2002/0179570 A1 Dec. 5, 2002

(51) Int. Cl.⁷ .................................. H01L 21/00
(52) U.S. Cl. .................. 438/695; 438/702; 438/703; 438/714; 216/37; 216/46; 216/67; 216/79
(58) Field of Search .................. 216/37, 46, 67, 216/79; 438/695, 702, 703, 714

(56) References Cited

U.S. PATENT DOCUMENTS

| | | |
|---|---|---|
| 4,784,720 A | 11/1988 | Douglas |
| 4,855,017 A | 8/1989 | Douglas |
| 5,871,659 A | 2/1999 | Sakano et al. |
| 6,069,091 A | 5/2000 | Chang et al. |
| 6,090,718 A | 7/2000 | Soga et al. |
| 6,093,655 A | 7/2000 | Donohoe et al. |
| 6,127,278 A | 10/2000 | Wang et al. |
| 6,235,643 B1 * | 5/2001 | Mui et al. .................. 438/719 |
| 6,583,065 B1 * | 6/2003 | Williams et al. ............ 438/714 |

FOREIGN PATENT DOCUMENTS

| | | |
|---|---|---|
| EP | 0744767 A2 | 11/1996 |
| WO | WO 98/15972 | 4/1998 |
| WO | WO 99/30359 | 6/1999 |
| WO | WO 99/67817 | 12/1999 |

* cited by examiner

*Primary Examiner*—Allan Olsen
(74) *Attorney, Agent, or Firm*—DeLio & Peterson, LLC; Peter W. Peterson; Todd M. C. Li, Esq.

(57) ABSTRACT

A method of etching a deep, high aspect ratio opening in a silicon substrate includes etching the substrate with a first plasma formed using a first gaseous mixture including a bromine containing gas, an oxygen containing gas and a first fluorine containing gas. The etching process with the first gaseous mixture produces a sidewall passivating deposit, which builds up near the opening entrance. To reduce this buildup, and to increase the average etching rate, the sidewall passivating deposit is periodically thinned by forming a second plasma using a mixture containing silane and a second fluorine containing gas. The substrate remains in the same plasma reactor chamber during the entire process and the plasma is continuously maintained during the thinning step. Holes of a depth greater than 40 times the width may be produced using repeated cycles of etching and thinning.

20 Claims, 4 Drawing Sheets

METHOD OF ETCHING HIGH ASPECT RATIO OPENINGS

BACKGROUND OF THE INVENTION

1. Field of the Invention

This invention relates to etching deep, high aspect ratio openings in a substrate during the construction of microelectronic devices. More specifically, this invention relates to etching such openings using a reactive ion etching process in plasma reactor.

2. Description of Related Art

The fabrication of deep, high aspect ratio openings and trenches in a silicon substrate is desirable in several areas of ultra large scale integration (ULSI) processing. Trenches having a depth:width ratio of greater than about 15:1 may be considered high aspect ratio, but trenches having an aspect ratio of greater than 40:1 are occasionally required.

Plasma reactors are conventionally used to construct high aspect ratio openings using a reactive ion etching (RIE) process in which one or more gaseous etchants are used to simultaneously etch the opening and produce a sidewall passivating deposit during the etching process. The sidewall passivating deposit protects the sidewalls during etching and helps obtain the desired trench profile. It is known, however, that the sidewall passivating deposit tends to produce a buildup on other portions of the substrate, mask and inner surfaces of the plasma reactor.

It is also known that the aspect ratio of the opening can have a significant effect on the etching process. Very high aspect ratio openings are particularly difficult to produce with the desired vertical, smooth walls using known etching methods. Producing such openings in a cost-effective manner, with high etching rates and good throughput is essential for newer products where the opening may have a width of 0.135 micrometers or less.

A conventional etchant composition for silicon that produces a sidewall passivating deposit includes hydrogen bromide (HBr), oxygen ($O_2$) and a fluorine containing compound such as sulfur hexafluoride ($SF_6$) or nitrogen trifluoride ($NF_3$). A silicon containing gas, such as silane ($SiH_4$) may be added to increase the silicon content and improve the deposition of the passivating deposit to protect the sidewalls during etching of deep openings.

U.S. Pat. No. 6,127,278 discloses a process in which a first step of etching using a mixture of HBr and $O_2$ to produce the sidewall passivating deposit is followed by a second step of etching/cleaning with a mixture of HBr, $O_2$ and $SF_6$ to remove the passivating material from the sidewalls of the opening, as well as from the substrate surface and chamber walls.

It is believed that one difficulty with earlier techniques for producing high aspect ratio openings is the excess buildup of the sidewall passivating deposit near the upper portion of the opening. This buildup restricts the entry of reactive etching ions/neutrals into the lower areas of the opening and slows the etching rate significantly. Proposed methods of controlling this deposit, however, have all required that the substrate be physically removed from the plasma reactor, or that the etching plasma be turned off. The time required for these methods all result in decreased throughput. Such methods have not only increased processing time, and thereby adversely impacted throughput, they have also resulted in rough or stepped wall surfaces in the opening as a result of significant changes in the processing parameters during etching.

Bearing in mind the problems and deficiencies of the prior art, it is therefore an object of the present invention to provide a method of etching deep, high aspect ratio openings in a substrate having a high average etching rate and good throughput.

It is another object of the present invention to provide a method of etching deep, high aspect ratio openings in a substrate where the etching may be completed in a single plasma reactor without removing the substrate from the reactor chamber.

It is still another object of the present invention to reduce aspect ratio dependent etch behavior during etching in silicon and other semiconductor materials.

A further object of the invention is to provide a method of etching deep, high aspect ratio openings in a substrate where the walls of the openings are smooth.

It is yet another object of the present invention to provide a method of etching deep, high aspect ratio openings in a substrate where the etching plasma is continuously maintained.

It is yet another object of the present invention to provide a method of etching trenches that increases the trench wall area.

It is a further object of the present invention to provide a method of constructing dynamic random access memory (DRAM) and embedded dynamic random access memory (e-DRAM) cells that have increased capacitance by etching deeper trenches.

Still other objects and advantages of the invention will in part be obvious and will in part be apparent from the specification.

SUMMARY OF THE INVENTION

The above and other objects and advantages, which will be apparent to one of skill in the art, are achieved in the present invention which is directed to, in a first aspect, a method of etching a deep, high aspect ratio opening in a substrate including the steps of:

etching the substrate with a first plasma formed using a first gaseous mixture including a bromine containing gas, an oxygen containing gas and a first fluorine containing gas, the etching step simultaneously producing a sidewall passivating deposit;

thinning the sidewall passivating deposit with a second plasma formed using a second gaseous mixture including a non-halogenated hydrogen containing gas and a second fluorine containing gas; and repeating the steps of etching and thinning to produce a desired depth for the opening.

In the preferred method, the non-halogenated hydrogen containing gas is selected from the group consisting of silanes and ammonia, most preferably, a monosilane or disilane. The substrate remains in the same plasma chamber during the cycles of etching and thinning the sidewall passivating deposit. The plasma is continuously maintained to produce a smooth sidewall within the opening and keep throughput high. The etching rate may be reduced substantially during the thinning step even though the plasma is continuously maintained.

The step of etching is preferably repeated at equally spaced intervals and the step of thinning the sidewall passivating deposit is also repeated at equally spaced intervals between the equally spaced etching steps. This alternation of etching and thinning is repeated until the desired depth is reached. The repetition may be as few as two cycles and as many as twenty or more cycles to reach the desired depth. The invention is particularly useful in producing openings having a final depth to width ratio of 40:1 or greater, however lesser aspect ratio openings may also advantageously constructed using the method of this invention.

The bromine containing gas is typically HBr. The first and second fluorine containing gases are typically $NF_3$, $SF_6$, elemental fluorine or a mixture thereof. The oxygen containing gas is preferably $O_2$.or $O_2$. mixed with helium. The non-halogenated hydrogen containing gas is preferably a silane, such as monosilane or disilane, or ammonia. A bromine containing gas or an oxygen containing gas may also be included in the second gaseous mixture during the step of thinning the sidewall passivating deposit.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

FIG. 1 shows the substrate and a patterned hard mask having an opening defining the width of the trench to be constructed.

FIG. 2 shows the trench after an initial step of etching has been completed to bring the trench to an initial depth in accordance with the method of the present invention. The sidewall passivating deposit formed by the method of the invention is shown. The sidewall passivating deposit has begun to narrow the upper portion of the trench and restrict the entry of the etchants into the trench.

FIG. 3 shows the trench of FIG. 2 after the step of thinning the sidewall passivating deposit in accordance with the method of the present invention has been completed.

FIG. 4 shows the trench after a second step of etching has been completed to bring the trench to an increased depth. Again the sidewall passivating deposit formed by the method of the invention has begun to narrow the upper portion of the trench and restrict the entry of the etchants into the trench.

DESCRIPTION OF THE PREFERRED EMBODIMENT(S)

Figure 1:
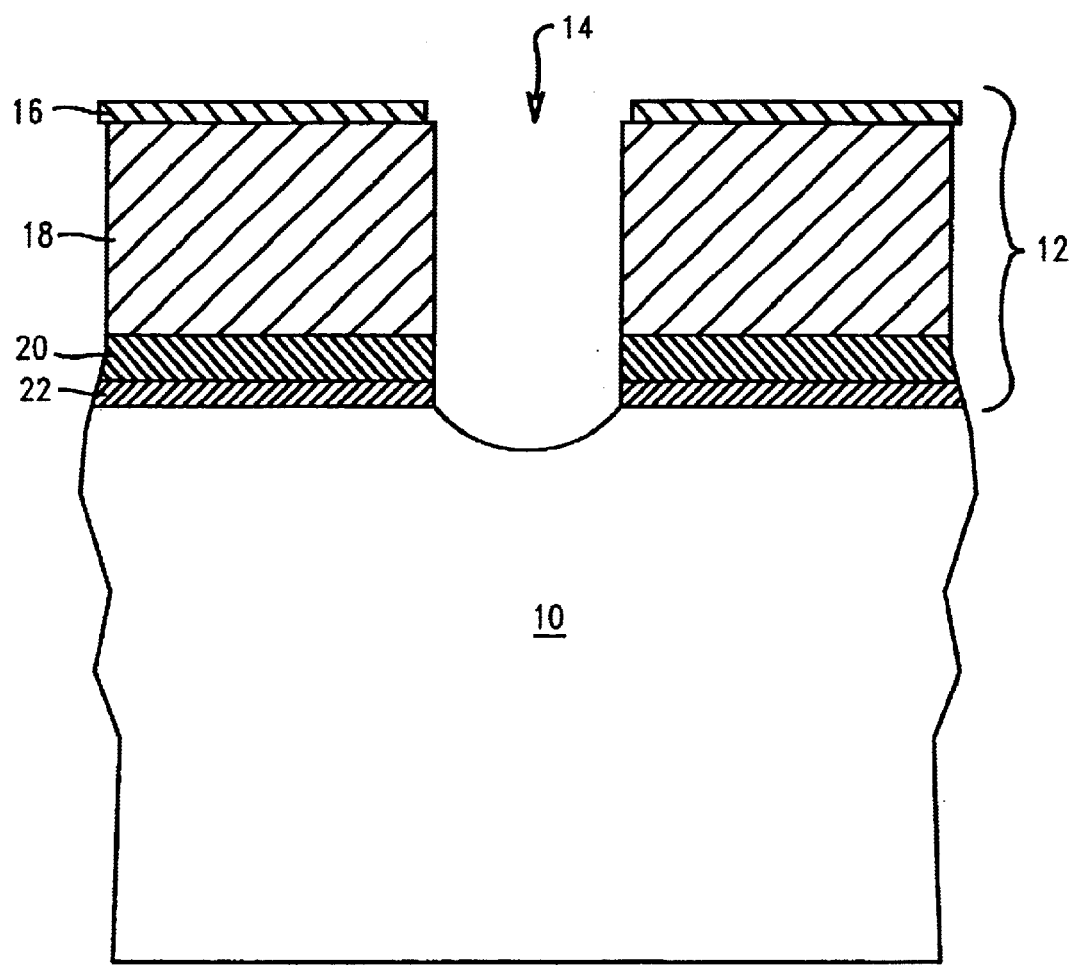
FIGS. 1–4 are schematic diagrams in cross-section showing different stages in the etching of a high aspect ratio trench into a substrate according to the method of the present invention.

In describing the preferred embodiment of the present invention, reference will be made herein to FIGS. 1–4 of the drawings in which like numerals refer to like features of the invention. Features of the invention are not necessarily shown to scale in the drawings.

FIG. 1 shows a wafer having a substrate 10 and a patterned hard mask stack 12 on the upper surface of the substrate 10. The hard mask stack includes an opening 14 that defines the width of a high aspect ratio opening to be produced in the substrate 10 by the method of this invention.

Opening 14 is produced in the hard mask stack 12 in a conventional manner and FIG. 1 illustrates the wafer without the resist material used to create opening 14. The wafer in FIG. 1 is shown substantially as it appears prior to being inserted into a plasma reactor for reactive ion etching using the method of this invention.

The hard mask stack 12 includes a cap oxide layer 16. The cap oxide layer 16 is preferably a plasma enhanced tetraethoxysilane (PETEOS) layer or any similar conventional cap oxide film. Beneath the cap oxide layer 16 is a doped oxide layer 18, such as a borosilicate glass (BSG) or borophosphosilicate glass (BPSG) layer. Beneath doped oxide layer 18 is a pad nitride film 20 and finally a thin pad oxide layer 22.

Those of skill in the art will recognize that other types of hard mask layers may also be used in connection with this invention provided that they adequately mask the surface of the substrate 10 during the etching steps described below. The substrate 10 is conventionally silicon, but other substrate materials may also be etched.

The method of this invention preferably starts with a native oxide breakthrough step in which a wafer having the patterned hard mask shown in FIG. 1 is placed into a plasma reactor and etched to remove any native oxide present on the surface of the open silicon areas. The purpose of the initial breakthrough process step is to prevent the formation of micro-mask, which if present, would produce a rough or grassy silicon surface during trench etching. The initial breakthrough step does not significantly change the appearance of the wafer, however, as can be seen at the bottom of opening 14 in FIG. 1, some of the silicon in the substrate may be lightly etched during this step.

An initial native oxide breakthrough etching step suitable for this invention includes forming a first plasma using a first gaseous mixture including a bromine containing gas, a fluorine containing gas and an oxygen containing gas. The bromine containing gas is preferably hydrogen bromide (HBr) at a gas flow rate of 100–300 sccm. The fluorine containing gas is preferably nitrogen trifluoride ($NF_3$) at a gas flow rate of 4–25 sccm. The oxygen containing gas is preferably oxygen ($O_2$) or a helium oxygen (He—$O_2$) mixture at a gas flow rate of up to 25 sccm.

Other process parameters that are suitable for the breakthrough step include: 500 watts RF power, a wafer electrode temperature in the range of 20–150° C., a wafer backside helium pressure of 2–30 torr and a reactor pressure of 20–300 mtorr.

After the substrate surface is cleaned with the breakthrough step, the opening 14 is deepened using a repeated sequence of etching steps, each etching step producing a sidewall passivating deposit that is thinned in a thinning step performed in the same plasma reactor with the plasma being continuously maintained.

The initial etching step after the breakthrough step is preferably performed using the same gaseous mixture described above that includes at least a bromine containing gas, a first fluorine containing gas and an oxygen containing gas. However, other bromine, fluorine and/or oxygen containing gases useful in RIE processing may be substituted for the HBr, $NF_3$ and $O_2$ described above, if desired, in accordance with known etching methods. For example, sulfur hexafluoride ($SF_6$), molecular fluorine ($F_2$) or other electronegative fluorine containing gases may be substituted for $NF_3$. The same process conditions described above for the breakthrough step may be used in this first etching step except that the RF power may now be changed, and preferably increased. A suitable range for power for the etching step is from 200–3000 watts.

Figure 2:
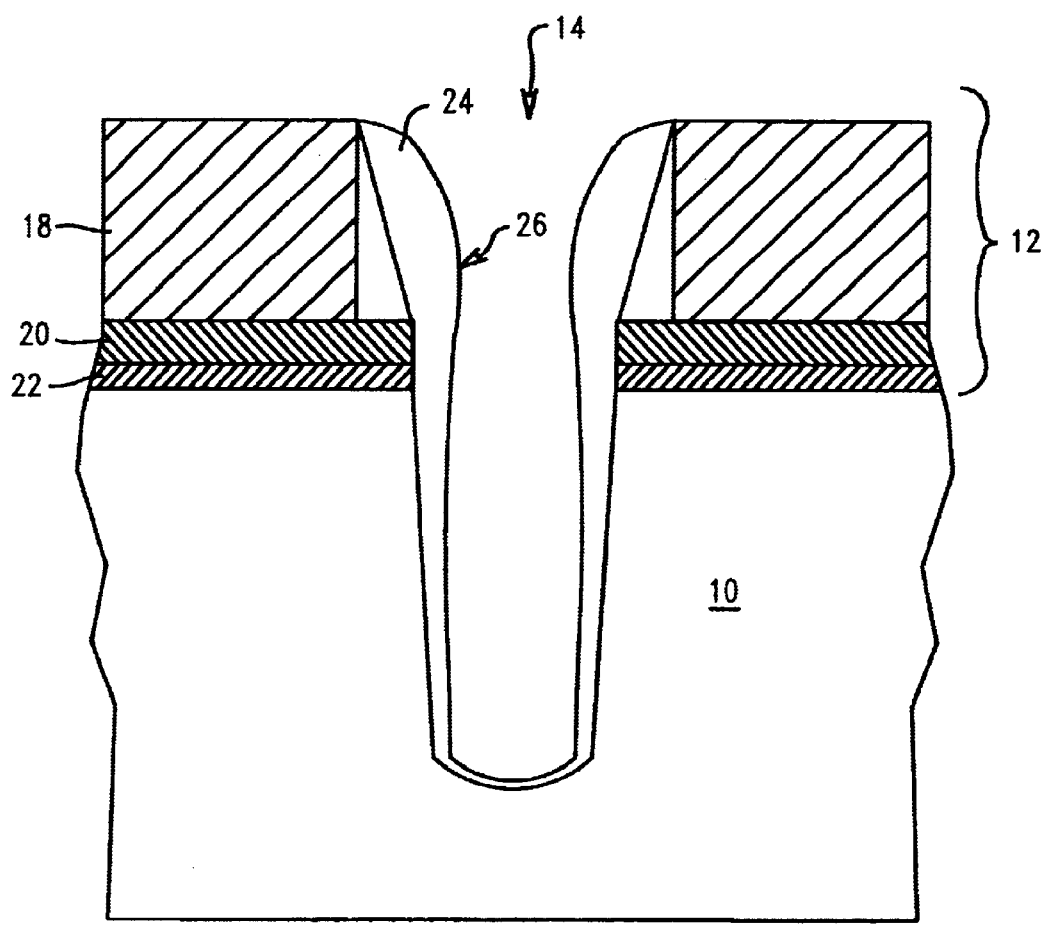

The results of the initial etching step are shown in FIG. 2. As can be seen, the initial etching step produces a sidewall passivating deposit 24 that protects the sidewalls during the etching process. However, the sidewall passivating deposit also builds up and eventually restricts the width of opening 14 near the hard mask 12, particularly in the region indicated with reference number 26. As the etching step proceeds, it becomes progressively more difficult for the reactive etchant ions to pass through the narrowed opening at 26 and reach the exposed silicon substrate surface at the bottom of the trench.

When the etching rate has dropped to an unacceptable level, the initial etching step is stopped and the excess sidewall passivating deposit 24 is partially or completely removed in a thinning step. The initial etching step is normally continued until opening 14 has reached 5–50% of the desired final depth. Accordingly there will be at least two etching steps of the type described above and there may be as many as twenty or more etching steps to produce very high aspect ratio openings and trenches.

After each etching step has been completed, the sidewall passivating deposit is thinned or removed with a second plasma formed using a second gaseous mixture containing at least a non-halogenated hydrogen containing gas and a second fluorine containing gas. The second fluorine containing gas may, or may not, be the same gas used in the initial etching step. Typically sulfur hexafluoride ($SF_6$), nitrogen trifluoride ($NF_3$) or molecular fluorine ($F_2$) will be used for the fluorine containing gas. Other fluorine containing electronegative gases can be substituted.

The non-halogenated hydrogen containing gas is preferably silane $SiH_4$, however other gases, such as ammonia ($NH_3$), may be used. The silane may be a monosilane or a disilane and is preferably premixed with helium. Oxygen ($O_2$), a predetermined mixture of helium and oxygen or other known oxygen containing gases may also be used.

In addition, a bromine containing gas, such as HBr may optionally be used during the thinning step. If a bromine containing gas is used during the thinning step, it is preferred that it be used at a reduced flow rate compared to the flow rate of the bromine containing gas used during the etching step.

Suitable process parameters for the thinning step include a wafer electrode temperature of 20–250° C., a wafer backside helium pressure of 2–30 torr and a reactor pressure of 20–300 mtorr. An example of suitable gases and flow rates for the thinning step include up to 250 sccm silane premixed with helium, up to 25 seem $SF_6$ and optionally, 0–5 seem $O_2$ or $HeO_2$ and 0–100 seem HBr. The RF power may range from 200 to 3,000 watts. The sidewall deposit thinning step is typically run for from 5–50% of the duration of the preceding etching step.

Figure 3:
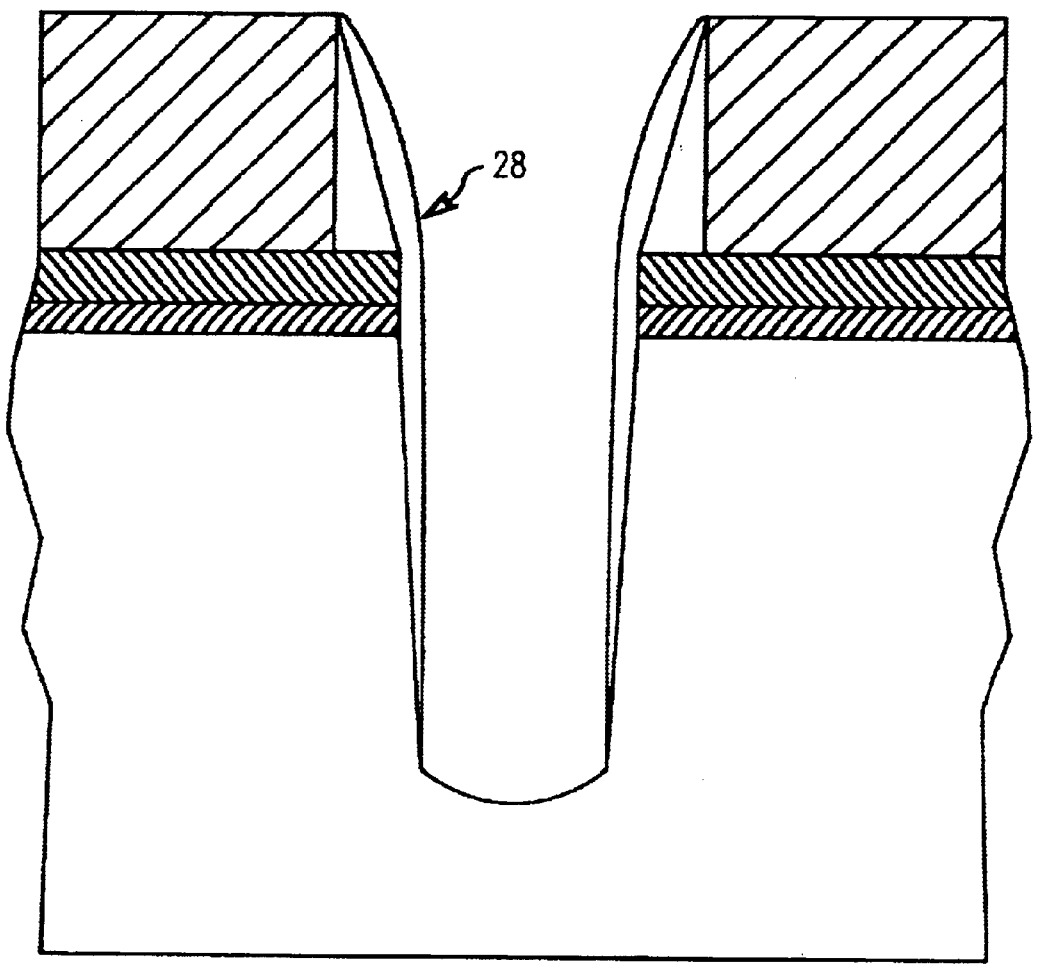

Although the present invention is not to be restricted by any theory of operation, it is believed that the mixture of the fluorine containing gas and the non-halogenated hydrogen containing gas forms hydrogen fluoride (HF) in the plasma phase, which reduces the thickness of the sidewall passivating deposit. The results of a typical thinning step are shown in FIG. 3.

During the thinning step, some etching may continue, however, the etching rate is significantly reduced as compared to the etching rate during the etching step due to the reduction of the flow rate of the bromine containing gas to zero or to a rate below the flow rate used during the etching step.

It should be noted that all of the steps described have taken place in the same reactor chamber. This allows the plasma to be continuously maintained during the breakthrough step, the initial etching step, the first thinning step and each subsequent cycle of etching and thinning. As a result, throughput is greatly increased as compared to prior art methods that require removal of the wafer from the reactor chamber.

After the first thinning step is completed, a second etching step is performed using the previously described first gaseous mixture with the same process parameters for etching described above. The flow rates and chamber pressure are the same as described in the breakthrough step and the wafer temperature and applied RF power are the same as described in the initial etching step.

Figure 4:
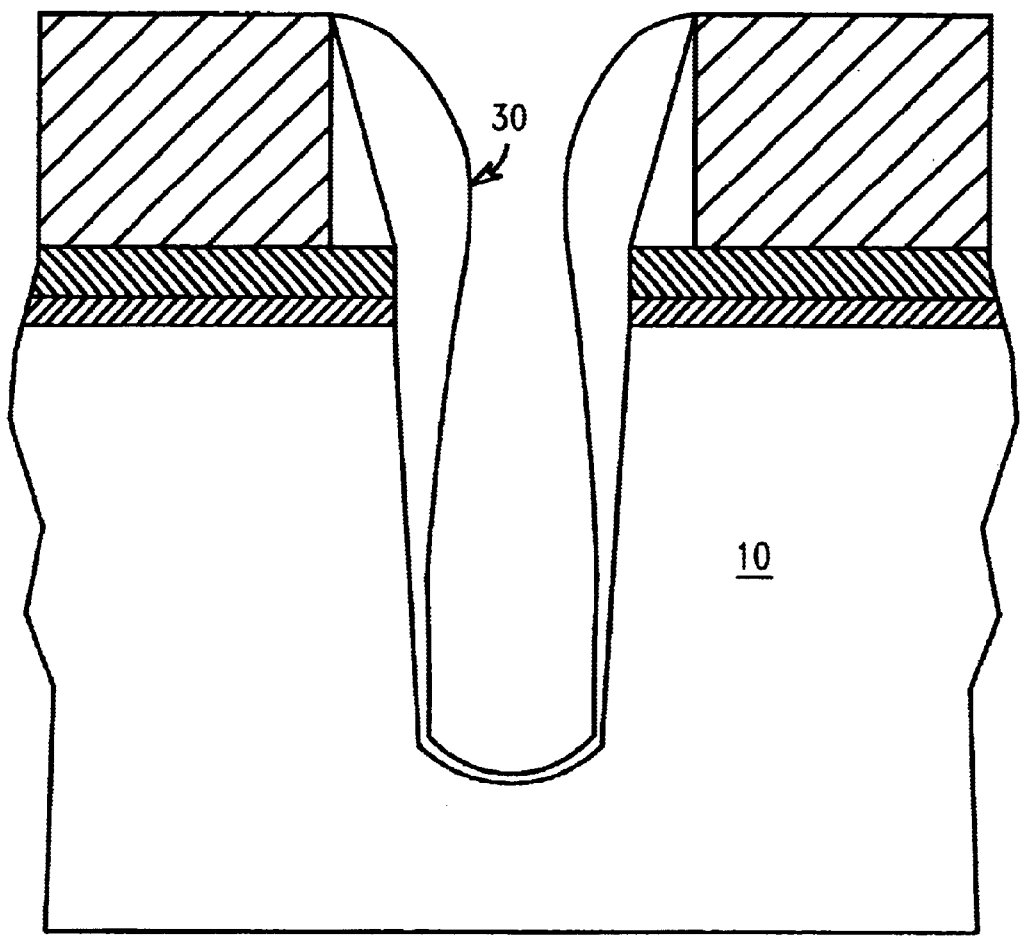

FIG. 4 illustrates the opening at the conclusion of the second etching step. As can be seen by comparing FIGS. 2, 3 and 4, the thinning step has opened the upper area of the trench in the region marked 28 and the second etching step has again narrowed the opening significantly in the region marked 30. As a result of the thickening sidewall deposit near the top of the opening, the etching rate slows during each etching step. Consequently, the step of thinning the sidewall passivating deposit is repeated in the manner previously described after each etching step is finished.

The cycle of etching, followed by thinning is repeated until the desired depth for opening 14 has been achieved. The repeated etching and thinning steps produce openings with clean vertical sides that have a high aspect ratio. Openings with an aspect ratio of 15:1 up to 40:1 or greater are easily produced by this method. The method is suitable for producing deep, high aspect ratio trenches and openings having a width of less than 0.135 micrometers.

The durations of the etching and thinning steps may be adjusted to maximize throughput. In a typical implementation of this method, the etching time for each cycle will be within the range of 1–5 minutes and the thinning step will increase the time for each complete etch and thin cycle by 5–50%. The etching and thinning steps will preferably be repeated at equally spaced intervals of time, although this is not essential to the invention.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method of etching a high aspect ratio opening in a substrate, the method comprising the steps of:
   etching the substrate with a first plasma formed using a first gaseous mixture including a bromine containing gas, an oxygen containing gas and a first fluorine containing gas, the etching step simultaneously producing a sidewall passivating deposit;
   thinning the sidewall passivating deposit with a second plasma formed using a second gaseous mixture including a non-halogenated hydrogen containing gas and a second fluorine containing gas; and
   repeating the steps of etching and thinning to produce a desired depth for the opening.

2. The method of claim 1 wherein the non-halogenated hydrogen containing gas is selected from the group consisting of silanes and ammonia.

3. The method of claim 1 wherein the non-halogenated hydrogen containing gas is monosilane or disilane.

4. The method of claim 1 wherein the second gaseous mixture also includes a bromine containing gas.

5. The method of claim 4 wherein the bromine containing gas is provided to the second gaseous mixture during the thinning step at flow rate that is less than the flow rate of the bromine containing gas provided to the first gaseous mixture during the etching step.

6. The method of claim 1 wherein the second gaseous mixture also includes an oxygen containing gas.

7. The method of claim 1 wherein the step of etching is repeated at equally spaced intervals and the step of thinning the sidewall passivating deposit is also repeated at equally spaced intervals between the equally spaced etching steps.

8. The method of claim 1 wherein the bromine containing gas in the first gaseous mixture is HBr.

9. The method of claim 1 wherein the first and second fluorine containing gases are selected from the group consisting of $NF_3$, $SF_6$, elemental fluorine and mixtures thereof.

10. The method of claim 9 wherein the first and second fluorine containing gases are $NF_3$.

11. The method of claim 1 wherein the steps of etching and thinning the sidewall passivating deposit are repeated at least twice.

12. The method of claim 1 wherein the etching and thinning steps occur in a single plasma reactor without removing the substrate from the plasma reactor.

13. The method of claim 1 wherein the steps of etching and thinning are repeated until the opening has a depth at least 15 times greater than a width of the opening.

14. The method of claim 1 wherein the steps of etching and thinning are repeated until the opening has a depth at least 40 times greater than a width of the opening.

15. The method of claim 1 wherein the bromine containing gas in the step of etching the substrate is HBr and the step of etching the substrate includes providing the HBr gas at a flow rate from 100–300 sccm.

16. The method of claim 1 wherein the first fluorine containing gas in the step of etching the substrate is $NF_3$ and the step of etching the substrate includes providing the $NF_3$ gas at a flow rate from 4–25 sccm.

17. The method of claim 1 wherein the oxygen containing gas in the step of etching the substrate is $O_2$ or $O_2$ mixed with helium and the step of etching the substrate includes providing the oxygen containing gas at a flow rate of up to 25 sccm.

18. The method of claim 1 wherein the second fluorine containing gas in the step of thinning the sidewall passivating deposit is $SF_6$ and the step of thinning the sidewall passivating deposit includes providing the second fluorine containing gas at a flow rate of up to 25 sccm.

19. The method of claim 1 wherein the non-halogenated hydrogen containing gas in the step of thinning the sidewall passivating deposit is silane and the step of thinning the sidewall passivating deposit includes providing the silane at a flow rate of up to 250 sccm.

20. A method of etching a high aspect ratio opening in a substrate, the method comprising the steps of:

etching the substrate with a first plasma formed using a first gaseous mixture including a bromine containing gas, an oxygen containing gas and a first fluorine containing gas selected from the group consisting of $NF_3$, $SF_6$, elemental fluorine and mixtures thereof, the etching step simultaneously producing a sidewall passivating deposit;

thinning the sidewall passivating deposit with a second plasma formed using a second gaseous mixture including a non-halogenated hydrogen containing gas selected from the group consisting of silane and ammonia, a second fluorine containing gas selected from the group consisting of $NF_3$, $SF_6$, elemental fluorine and mixtures thereof, and at least one additional gas selected from the group consisting of a bromine containing gas and an oxygen containing gas; and repeating the steps of etching and thinning to produce a desired depth for the opening.

* * * * *